US012652499B2

(12) United States Patent
Yamamoto

(10) Patent No.: US 12,652,499 B2
(45) Date of Patent: *Jun. 9, 2026

(54) ULTRASONIC TRANSDUCER AND PARAMETRIC SPEAKER INCLUDING THE SAME

(71) Applicant: Murata Manufacturing Co., Ltd., Nagaokakyo (JP)

(72) Inventor: Hironari Yamamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 127 days.

This patent is subject to a terminal disclaimer.

(21) Appl. No.: 18/768,323

(22) Filed: Jul. 10, 2024

(65) Prior Publication Data

US 2024/0365071 A1 Oct. 31, 2024

Related U.S. Application Data

(63) Continuation of application No. PCT/JP2023/017124, filed on May 2, 2023.

(30) Foreign Application Priority Data

Oct. 26, 2022 (JP) ................................. 2022-171351

(51) Int. Cl.
*H04R 17/10* (2006.01)
*B06B 1/06* (2006.01)
(Continued)

(52) U.S. Cl.
CPC ........... *H04R 17/10* (2013.01); *H10N 30/204* (2023.02); *H04R 2217/03* (2013.01); *H04R 2307/027* (2013.01); *H04R 2400/11* (2013.01)

(58) Field of Classification Search
None
See application file for complete search history.

(56) References Cited

U.S. PATENT DOCUMENTS

2013/0307633 A1 11/2013 Onishi et al.
2019/0081711 A1 3/2019 Yoshida

FOREIGN PATENT DOCUMENTS

CN 103262568 A * 8/2013 ............. H04R 1/227
JP 2002079177 A * 3/2002 ....... H01L 21/67051
(Continued)

OTHER PUBLICATIONS

International Search Report in PCT/JP2023/017124, mailed Aug. 1, 2023, 4 pages.
(Continued)

*Primary Examiner* — Qin Zhu
(74) *Attorney, Agent, or Firm* — Keating & Bennett, LLP

(57) ABSTRACT

An ultrasonic transducer includes a first diaphragm, one or more frame bodies, and one or more ultrasonic vibrators. The one or more frame bodies extend in a length direction and are bonded to the first diaphragm. The one or more ultrasonic vibrators are attached to the one or more frame bodies, respectively, and face the first diaphragm with a space therebetween. The first diaphragm is structured to resonate and vibrate in a direction orthogonal or substantially orthogonal to the first diaphragm in a phase opposite to a phase of the one or more ultrasonic vibrators. A dimension in the length direction inside the one or more frame bodies is equal to or greater than four times a dimension in a width direction orthogonal to the length direction inside the one or more frame bodies.

20 Claims, 16 Drawing Sheets

(51) Int. Cl.
 H04R 7/04 (2006.01)
 H04R 17/00 (2006.01)
 H10N 30/20 (2023.01)

(56) References Cited

FOREIGN PATENT DOCUMENTS

| JP | 2003047085 | A | | 2/2003 |
| JP | 2003159566 | A | * | 6/2003 |
| JP | 6333480 | B1 | | 5/2018 |
| JP | 2020068482 | A | | 4/2020 |
| WO | 2012090383 | A1 | | 7/2012 |

OTHER PUBLICATIONS

Written Opinion in PCT/JP2023/017124, mailed Aug. 1, 2023, 8 pages.

* cited by examiner

100

110

120

131

131

130

Z

Y X

122

120

121

L2

L1

122

Z

Y X

RESONANT
FREQUENCY (kHz)

LONGITUDINAL DIMENSION
INSIDE FRAME BODY (mm)

FIG.8
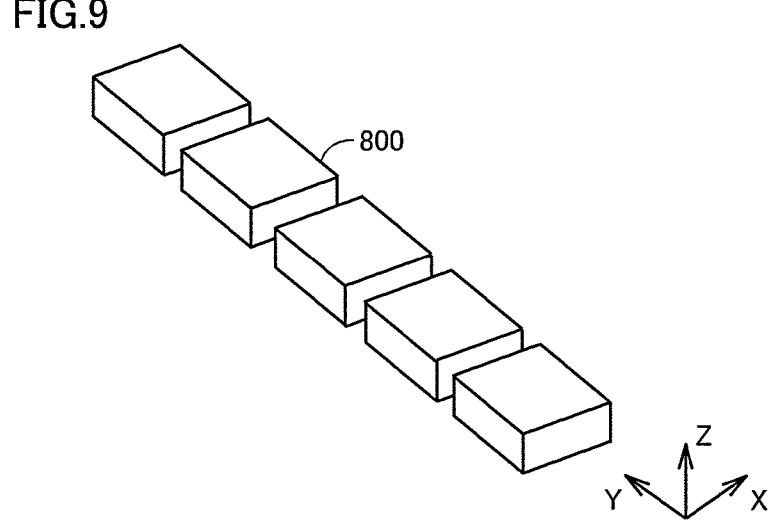
SOUND PRESSURE (Pa)
LONGITUDINAL DIMENSION INSIDE FRAME BODY (mm)
FIG.9
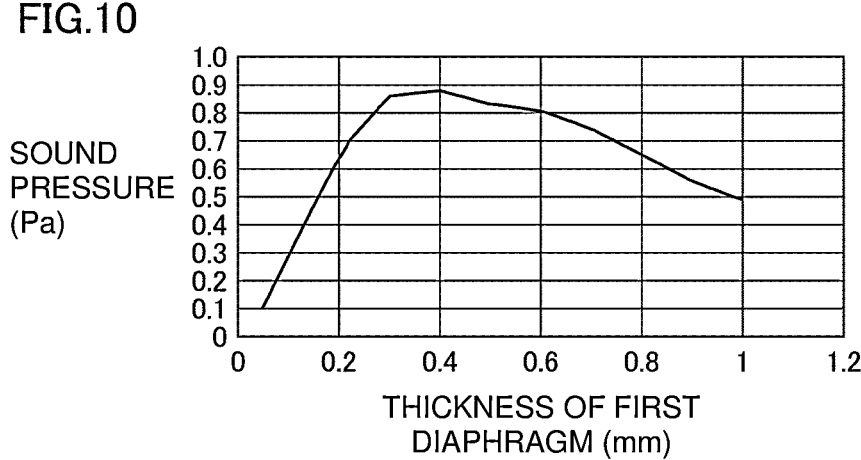
FIG.10
SOUND PRESSURE (Pa)
THICKNESS OF FIRST DIAPHRAGM (mm)

INTERNAL
STRESS IN
Z-AXIS
DIRECTION
PER SOUND
PRESSURE

THICKNESS OF FIRST DIAPHRAGM (mm)

DISPLACEMENT
(%)

FREQUENCY (kHz)

SOUND PRESSURE LEVEL (dB)

PROPAGATION DISTANCE (cm)

DRIVE START
DELAY TIME

A     B     C     D     E     F     G

200a

Db 210
220
131
131 } 130
240

A   B   C   D   E   F   G

Z
Y   X

DRIVE START
DELAY TIME

A     B     C     D     E     F     G

ULTRASONIC TRANSDUCER AND PARAMETRIC SPEAKER INCLUDING THE SAME

CROSS REFERENCE TO RELATED APPLICATIONS

This application claims the benefit of priority to Japanese Patent Application No. 2022-171351 filed on Oct. 26, 2022 and is a Continuation Application of PCT Application No. PCT/JP2023/017124 filed on May 2, 2023. The entire contents of each application are hereby incorporated herein by reference.

BACKGROUND OF THE INVENTION

1. Field of the Invention

The present invention relates to ultrasonic transducers and parametric speakers including the same.

2. Description of the Related Art

As related art documents disclosing a configuration of a super-directive acoustic device, there are Japanese Unexamined Patent Application Publication No. 2003-47085 and Japanese Patent No. 6333480. The super-directive acoustic device described in Japanese Unexamined Patent Application Publication No. 2003-47085 is configured by laying out a plurality of ultrasonic vibrators on one printed circuit board and arranging the ultrasonic vibrators so that an outer periphery thereof has a substantially circular shape. The plurality of ultrasonic vibrators are divided into two groups having different installation heights.

The super-directive acoustic device described in Japanese Patent No. 6333480 includes a first ultrasonic emitter and a second ultrasonic emitter. The second ultrasonic emitter is arranged on an axial center and in front of a radiation surface of the first ultrasonic emitter. A phase of a carrier signal emitted by the second ultrasonic emitter is opposite to a phase of a carrier signal included in a signal emitted by the first ultrasonic emitter.

In the super-directive acoustic device described in Japanese Unexamined Patent Application Publication No. 2003-47085, the plurality of ultrasonic vibrators are arranged in the two groups having the different installation heights, and the configuration is complicated. In the super-directive acoustic device described in Japanese Patent No. 6333480, the second ultrasonic emitter is arranged outside the first ultrasonic emitter, and thus the device is increased in size.

SUMMARY OF THE INVENTION

Example embodiments of the present invention provide ultrasonic transducers that are each able to increase a sound pressure level with a simple and compact configuration, and parametric speakers each including the same.

An ultrasonic transducer according to an example embodiment of the present invention includes a first diaphragm, one or more frame bodies, and one or more ultrasonic vibrators. The one or more frame bodies extend in a length direction and are bonded to the first diaphragm. The one or more ultrasonic vibrators are attached the to one or more frame bodies, respectively, and face the first diaphragm with a space therebetween. The first diaphragm is structured to resonate and vibrate in a direction orthogonal or substantially orthogonal to the first diaphragm in a phase opposite to a phase of the one or more ultrasonic vibrators. A dimension in the length direction inside the one or more frame bodies is equal to or greater than four times a dimension in a width direction orthogonal or substantially orthogonal to the length direction inside the one or more frame bodies.

According to example embodiments of the present invention, it is possible to increase a sound pressure level with a simple and compact configuration in an ultrasonic transducer.

The above and other elements, features, steps, characteristics and advantages of the present invention will become more apparent from the following detailed description of the example embodiments with reference to the attached drawings.

BRIEF DESCRIPTION OF THE DRAWINGS

FIG. 8 is a graph obtained by a simulation analysis of a sound pressure transition of ultrasonic waves transmitted from the ultrasonic transducer when the longitudinal dimension is changed while the short dimension inside the frame body is fixed, using a finite element method.

FIG. 9 is a perspective view illustrating a configuration of an ultrasonic element array according to a first comparative example.

FIG. 10 is a graph obtained by a simulation analysis about a relationship between the sound pressure of the ultrasonic waves transmitted from the ultrasonic transducer, and a thickness of the first diaphragm, using a finite element method.

FIG. 16 is a longitudinal sectional view illustrating a configuration of an ultrasonic transducer according to a sixth modification of an example embodiment of the present invention.

FIG. 19 is an exploded perspective view illustrating a stacked state in a step of stacking and bonding components of the ultrasonic transducer according to Example Embodiment 2 of the present invention.

FIG. 20 is a plan view illustrating a positional relationship in a width direction (X-axis direction) in a step of cutting a piezoelectric body of the ultrasonic transducer according to Example Embodiment 2 of the present invention.

DETAILED DESCRIPTION OF THE EXAMPLE EMBODIMENTS

Figure 1:
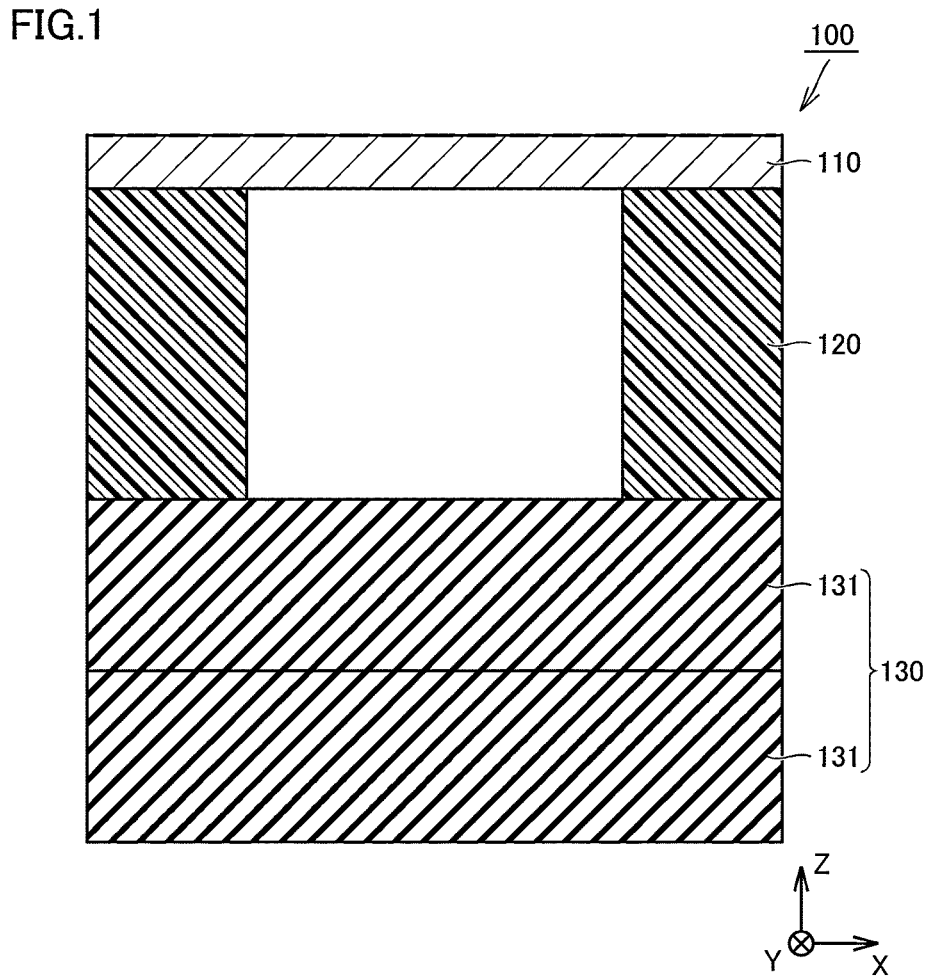
FIG. 1 is a longitudinal sectional view illustrating a configuration of an ultrasonic transducer according to Example Embodiment 1 of the present invention.

Hereinafter, ultrasonic transducers according to each example embodiment of the present invention will be described with reference to the drawings. In the following description of the example embodiments, the same or corresponding element and portions in the drawings are denoted by the same reference numerals, and the description thereof will not be repeated. Example embodiments of the present invention are applicable to applications requiring high-sound-pressure ultrasonic waves, such as ultrasonic transducers for parametric speakers, ultrasonic sensors, or non-contact haptics, for example. In the following example embodiments, an ultrasonic transducer for a parametric speaker will be described as an example, but the use of the ultrasonic transducer is not limited thereto.

Example Embodiment 1

Figures 2, 3:
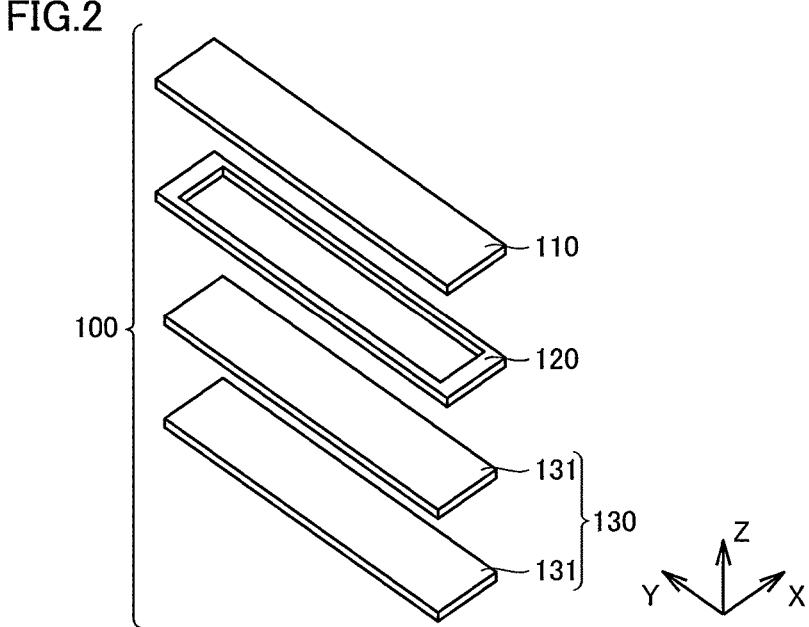
FIG. 2 is an exploded perspective view illustrating the configuration of the ultrasonic transducer according to Example Embodiment 1 of the present invention.
FIG. 3 is a perspective view illustrating a configuration of a frame body included in the ultrasonic transducer according to Example Embodiment 1 of the present invention.

FIG. 1 is a longitudinal sectional view illustrating a configuration of an ultrasonic transducer according to Example Embodiment 1 of the present invention. FIG. 2 is an exploded perspective view illustrating the configuration of the ultrasonic transducer according to Example Embodiment 1 of the present invention. As illustrated in FIG. 1 and FIG. 2, an ultrasonic transducer 100 according to Example Embodiment 1 of the present invention includes a first diaphragm 110, a frame body 120, and an ultrasonic vibrator 130.

The first diaphragm 110 has a flat plate shape. The first diaphragm 110 is made of, for example, an aluminum alloy such as duralumin including aluminum, or metal such as stainless steel. In the present example embodiment, the first diaphragm 110 is made of, for example, stainless steel. A thickness of the first diaphragm 110 is, for example, equal to or greater than about 0.1 mm and equal to or less than about 0.2 mm.

The frame body 120 has a rectangular or substantially rectangular annular shape. The frame body 120 includes a width direction (X-axis direction) and a length direction (Y-axis direction). The frame body 120 extends in the length direction (Y-axis direction). An axial direction of the frame body 120 is aligned with a height direction (Z-axis direction). One end of the frame body 120 in the height direction (Z-axis direction) is bonded to the first diaphragm 110 by a bonding agent made of an epoxy resin or the like, for example.

The frame body 120 is made of, for example, an aluminum alloy or metal such as stainless steel, glass epoxy, resin, or the like. From a viewpoint of reducing or preventing a change in characteristics of the ultrasonic transducer 100 due to a change in temperature, the frame body 120 is preferably made of, for example, metal. On the other hand, from a viewpoint of lowering a frequency of ultrasonic waves transmitted or received by the ultrasonic transducer 100, and from a viewpoint of miniaturizing the ultrasonic transducer 100, the frame body 120 is preferably made of resin. In the present embodiment, the frame body 120 is made of, for example, stainless steel. A thickness of the frame body 120 is, for example, equal to or greater than about 0.2 mm and equal to or less than about 0.8 mm.

FIG. 3 is a perspective view illustrating a configuration of the frame body included in the ultrasonic transducer according to Example Embodiment 1 of the present invention. As illustrated in FIG. 3, the frame body 120 includes a pair of long side portions 121 extending in the length direction (Y-axis direction) and a pair of short side portions 122 extending in the width direction (X-axis direction). An average interval between the short side portions 122 is equal to or greater than four times a shortest interval between the long side portions 121. That is, a longitudinal dimension L1 in the length direction (Y-axis direction) inside the frame body 120 is equal to or greater than four times a short dimension L2 in the width direction (X-axis direction) inside the frame body 120.

A corner portion interposed between the long side portion 121 and the short side portion 122 may be chamfered, for example. Further, the short side portion 122 is not limited to be in a linear shape when viewed in the height direction (Z-axis direction), and may have, for example, an arc shape that is convex toward an inside of the frame body 120 or an arc shape that is convex toward an outside of the frame body 120.

A resonant frequency of the first diaphragm 110 can be adjusted by changing the short dimension L2 in the width direction (X-axis direction) inside the frame body 120. For example, when the resonant frequency of the first diaphragm 110 is set to be equal to or higher than about 100 kHz, the short dimension L2 is equal to or greater than about 1.5 mm and equal to or less than about 3 mm.

The longitudinal dimension L1 in the length direction (Y-axis direction) inside the frame body 120 is equal to or greater than four times the short dimension L2, and from a viewpoint of increasing a sound pressure level of ultrasonic waves transmitted by the ultrasonic transducer 100, the longitudinal dimension L1 is, for example, equal to or greater than about 20 mm.

Figures 4, 5:
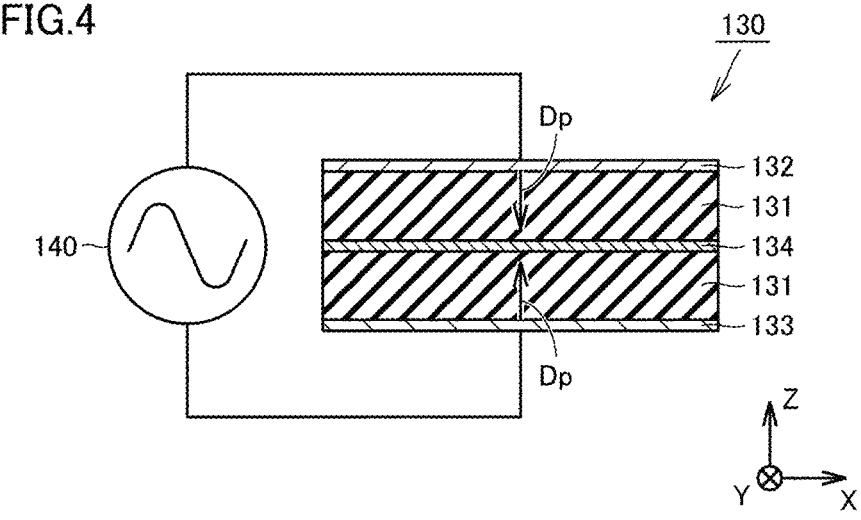
FIG. 4 is a sectional view illustrating a configuration of an ultrasonic vibrator included in the ultrasonic transducer according to Example Embodiment 1 of the present invention.
FIG. 5 is a perspective view showing a displacement state obtained by a simulation analysis using a finite element method when the ultrasonic transducer according to Example Embodiment 1 of the present invention is transmitting or receiving ultrasonic waves.

FIG. 4 is a sectional view illustrating a configuration of the ultrasonic vibrator included in the ultrasonic transducer according to Example Embodiment 1 of the present invention. As illustrated in FIG. 1, the ultrasonic vibrator 130 is attached to the frame body 120 and faces the first diaphragm 110 with a space in between. Specifically, the ultrasonic vibrator 130 is attached to another end of the frame body 120 in the height direction (Z-axis direction), and faces the first diaphragm 110 with an inner space of the frame body 120 in between.

As illustrated in FIG. 1, FIG. 2 and FIG. 4, the ultrasonic vibrator 130 is a piezoelectric element including a piezoelectric body 131. As illustrated in FIG. 4, in the present example embodiment, the ultrasonic vibrator 130 includes two stacked piezoelectric bodies 131. Polarization directions Dp of the two piezoelectric bodies 131 are different from each other. Specifically, the polarization directions Dp of the two piezoelectric bodies 131 face each other in the height direction (Z-axis direction). The two piezoelectric bodies 131 are sandwiched between a first electrode 132 and a second electrode 133, and an intermediate electrode 134 is arranged between the two piezoelectric bodies 131. The first electrode 132 and the second electrode 133 are electrically connected to a processing circuit 140 configured or programmed to apply an AC voltage. The ultrasonic vibrator 130 is, for example, a series bimorph piezoelectric vibrator. A total of thicknesses of the two piezoelectric bodies 131 is, for example, equal to or greater than about 0.5 mm and equal to or less than about 0.85 mm.

Figures 6, 7:
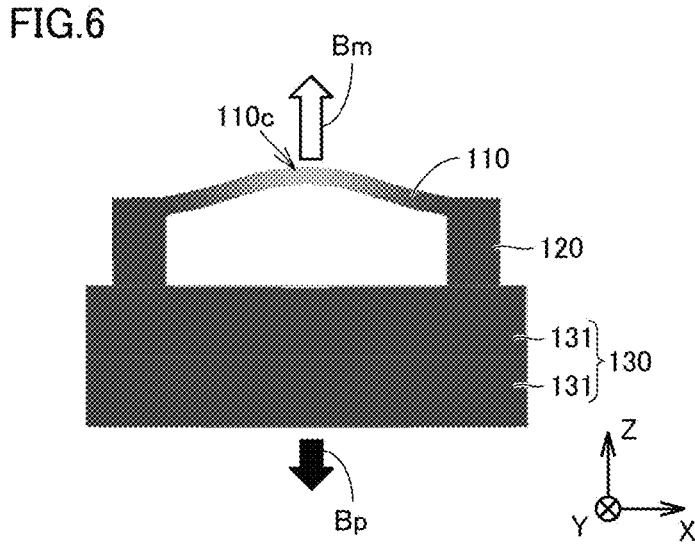
FIG. 6 is a sectional view of the ultrasonic transducer of FIG. 5 taken along line VI-VI as viewed in a direction of arrows.
FIG. 7 is a graph obtained by a simulation analysis of a transition of a resonant frequency of a first diaphragm when a longitudinal dimension is changed while a short dimension inside a frame body is fixed, using a finite element method.

FIG. 5 is a perspective view showing a displacement state obtained by a simulation analysis using a finite element method when the ultrasonic transducer according to Example Embodiment 1 of the present invention is transmitting or receiving ultrasonic waves. FIG. 6 is a sectional view of the ultrasonic transducer of FIG. 5 taken along line VI-VI as viewed in a direction of arrows. As simulation analysis conditions, for example, the thickness of the first diaphragm 110 was about 0.1 mm, the total thickness of the two piezoelectric bodies 131 was about 0.8 mm, the longitudinal dimension L1 inside the frame body 120 was about 20 mm, the short dimension L2 was 2 mm, and the thickness of the frame body 120 in the height direction (Z-axis direction) was about 0.4 mm.

As illustrated in FIG. 5 and FIG. 6, in a vibration mode of the ultrasonic transducer 100 according to Example Embodiment 1 of the present invention, the first diaphragm 110 resonates and vibrates in a phase opposite to that of the ultrasonic vibrator 130 in the height direction (Z-axis direction) orthogonal or substantially orthogonal to the first diaphragm 110. That is, as illustrated in FIG. 6, a displacement direction of a resonant vibration Bm of the first diaphragm 110, and a displacement direction of a resonant vibration Bp of the ultrasonic vibrator 130 are opposite to each other in the height direction (Z-axis direction). In the present example embodiment, the resonant frequency of the first diaphragm 110 and a resonant frequency of the ultrasonic vibrator 130 are equal to or higher than about 100 kHz, for example.

In the first diaphragm 110, an intermediate portion 110c positioned at a middle in the length direction inside the frame body 120 becomes an antinode of the resonant vibration, and end portions 110e positioned at respective ends in the length direction inside the frame body 120 become nodes of the resonant vibration. That is, a portion of the first diaphragm 110 positioned above the inner space of the frame body 120 is a vibrating region that resonates and vibrates. A longitudinal dimension of the vibrating region of the first diaphragm 110 is equal or substantially equal to the longitudinal dimension L1 inside the frame body 120, and a short dimension of the vibrating region of the first diaphragm 110 is equal or substantially equal to the short dimension L2 inside the frame body 120.

Here, a relationship between the resonant frequency of the first diaphragm 110 and the longitudinal dimension L1 inside the frame body 120 will be described.

FIG. 7 is a graph obtained by a simulation analysis of a transition of the resonant frequency of the first diaphragm when the longitudinal dimension is changed while the short dimension inside the frame body is fixed, using a finite element method. In FIG. 7, a vertical axis represents the resonant frequency (kHz) of the first diaphragm 110, and a horizontal axis represents the longitudinal dimension L1 (mm) inside the frame body 120. As a simulation analysis condition, for example, the short dimension L2 inside the frame body 120 was fixed to about 2 mm.

As shown in FIG. 7, for example, the resonant frequency of the first diaphragm 110 was about 220 kHz when the longitudinal dimension L1 inside the frame body 120 was 2 mm, and the resonant frequency of the first diaphragm 110 was decreased to about 122 kHz when the longitudinal dimension L1 was increased to about 8 mm and thus the longitudinal dimension of the vibrating region of the first diaphragm 110 was increased. Thereafter, even when the longitudinal dimension L1 inside the frame body 120 was increased to be greater than about 8 mm and the longitudinal dimension of the vibrating region of the first diaphragm 110 was further increased, the resonant frequency of the first diaphragm 110 becomes substantially constant at about 122 KHz.

That is, the resonant frequency of the first diaphragm 110 is determined by acoustic velocity in the first diaphragm 110 and reflection of vibration with the frame body 120 as fixed ends, but the influence of the short dimension L2 becomes dominant with respect to the reflection of vibration from when the longitudinal dimension L1 inside the frame body 120 exceeds four times the short dimension L2, and the state of reflection of vibration does not change even when the long dimension L1 becomes further greater than four times the short dimension L2.

Next, a result of a simulation analysis about a relationship between the sound pressure of an ultrasonic wave transmitted from the ultrasonic transducer 100 and the longitudinal dimension L1 inside the frame body 120 using a finite element method will be described.

FIG. 8 is a graph obtained by a simulation analysis of a sound pressure transition of an ultrasonic wave transmitted from the ultrasonic transducer when the longitudinal dimension is changed while the short dimension inside the frame body is fixed, using a finite element method. In FIG. 8, a vertical axis represents the sound pressure (Pa) transmitted from the ultrasonic transducer 100, and a horizontal axis represents the longitudinal dimension L1 (mm) inside the frame body 120. As a simulation analysis condition, for example, the short dimension L2 inside the frame body 120 was fixed to about 2 mm, and the sound pressure (Pa) at a position separated by about 30 cm in the height direction (Z-axis direction) from the first diaphragm 110 in front of the ultrasonic transducer 100 was calculated.

As shown in FIG. 8, the sound pressure of the ultrasonic wave transmitted from the ultrasonic transducer 100 was increased as the longitudinal dimension L1 inside the frame body 120 was increased. This means that even when the longitudinal dimension of the vibrating region of the first diaphragm 110 was increased, an entirety of the vibrating region of the first diaphragm 110 between both the end portions 110e vibrates. That is, an area of the vibrating region can be increased by an increment corresponding to an increased length of the vibrating region of the first diaphragm 110, and as a result, a change in pressure of the air due to the vibration of the first diaphragm 110 can be increased to obtain a high sound pressure.

As described above, in the ultrasonic transducer 100 according to the present example embodiment, the sound pressure can be increased while maintaining the resonant frequency substantially constant by increasing the longitudinal dimension of the vibrating region of the first diaphragm 110. In addition, since there are node points at respective end portions in the length direction, both of the end portions can be supported or fixed, and thus the ultrasonic transducer 100 can be easily mounted.

Here, an ultrasonic element array according to a first comparative example in which a high sound pressure is obtained by arranging high-frequency ultrasonic elements side by side will be described.

FIG. 9 is a perspective view illustrating a configuration of the ultrasonic element array according to the first comparative example. As illustrated in FIG. 9, in the ultrasonic element array according to the first comparative example, a plurality of ultrasonic elements 800 are arranged such that the elements are aligned in the length direction (Y-axis direction) at intervals. In such an ultrasonic element array, since a space in which a sound pressure is not generated exists between the ultrasonic elements 800, efficiency is reduced. Further, for example, since the ultrasonic element 800 of a high frequency equal to or higher than about 100 kHz is small in size, it takes time and effort to configure the ultrasonic element array by mounting the plurality of aligned ultrasonic elements 800.

Hereinafter, the thickness of the first diaphragm 110 included in the ultrasonic transducer 100 according to an example embodiment of the present invention will be described in detail.

The first diaphragm 110 and the ultrasonic vibrator 130 resonate and vibrate in phases opposite to each other, and are in a vibration mode, such as, for example, a tuning fork vibration. From a viewpoint of maintaining physical balance between the first diaphragm 110 and the ultrasonic vibrator 130, it is preferable that a relationship of 0.7 CpTp/Cv≤Tv≤1.3 CpTp/Cv is satisfied, where Cv is acoustic velocity of a transverse wave of the first diaphragm 110, Cp is acoustic velocity of a transverse wave of the piezoelectric body 131, Tv is a thickness dimension of the first diaphragm 110, and Tp is a thickness dimension of the piezoelectric body 131. The acoustic velocity Cv of the transverse wave of the first diaphragm 110 is determined by a material of the first diaphragm 110. The acoustic velocity Cp of the transverse wave of the piezoelectric body 131 is determined by a material of the piezoelectric body 131. When there are a plurality of the stacked piezoelectric bodies 131 in the ultrasonic vibrator 130, the thickness dimension Tp of the piezoelectric bodies 131 is a total value of a thickness of each of the plurality of piezoelectric bodies 131.

By satisfying the relationship of 0.7 CpTp/Cv≤Tv≤1.3 CpTp/Cv, it is possible to reduce or prevent vibration leakage while maintaining the physical balance between the first diaphragm 110 and the ultrasonic vibrator 130 during vibration, and increasing amplitude of the resonant vibration of the first diaphragm 110 to increase the sound pressure. It is more preferable that a relationship of Tv=CpTp/Cv is satisfied. From a viewpoint of maintaining the physical balance, for example, when Tp=about 0.8, it is preferable that the thickness dimension Tv of the first diaphragm 110 is about 0.4 from a relational equation of Tv=0.8 Cp/Cv.

FIG. 10 is a graph obtained by a simulation analysis about a relationship between the sound pressure of the ultrasonic wave transmitted from the ultrasonic transducer, and the thickness of the first diaphragm, using a finite element method. In FIG. 10, a vertical axis represents the sound pressure (Pa) transmitted from the ultrasonic transducer 100, and a horizontal axis represents the thickness (mm) of the first diaphragm. As a simulation analysis condition, for example, the total value Tp of the thicknesses of the two piezoelectric bodies 131 was about 0.8 mm. As shown in FIG. 10, when the thickness of the first diaphragm 110 was about 0.4 mm, the sound pressure of the ultrasonic wave transmitted from the ultrasonic transducer was maximized.

Figure 11:
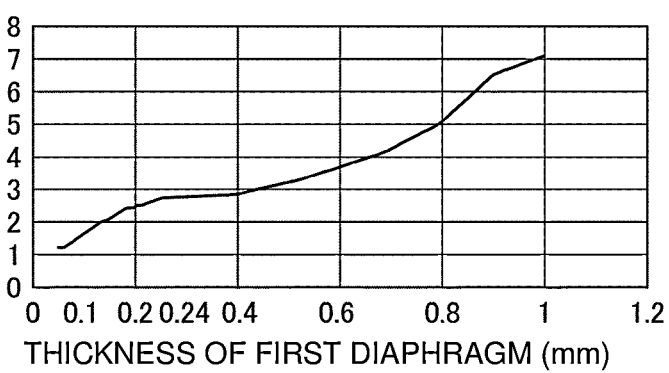
FIG. 11 is a graph obtained by a simulation analysis about a relationship between internal stress (value normalized per sound pressure) in a height direction (Z-axis direction) generated in the ultrasonic transducer and the thicknesses of the first diaphragm, using a finite element method.

FIG. 11 is a graph obtained by a simulation analysis about a relationship between internal stress (value normalized per sound pressure) in the height direction (Z-axis direction) generated in the ultrasonic transducer and the thicknesses of the first diaphragm, using a finite element method. In FIG. 11, a vertical axis represents the internal stress in the height direction (Z-axis direction) per sound pressure, and a horizontal axis represents the thickness (mm) of the first diaphragm.

As shown in FIG. 11, as the thickness of the first diaphragm 110 was decreased, the internal stress (value normalized per sound pressure) in the height direction (Z-axis direction) generated in the ultrasonic transducer 100 was decreased. In particular, when the thickness of the first diaphragm 110 was equal to or less than about 0.24 mm, the internal stress (value normalized per sound pressure) in the height direction (Z-axis direction) generated in the ultrasonic transducer 100 was significantly decreased. By decreasing the internal stress (value normalized per sound pressure) in the height direction (Z-axis direction) generated in the ultrasonic transducer 100, it is possible to reduce or prevent generation of cracks due to the internal stress in each of a bonding portion between the first diaphragm 110 and the frame body 120 and a bonding portion between the frame body 120 and the ultrasonic vibrator 130. On the other hand, when the thickness of the first diaphragm 110 is less than about 0.1 mm, the first diaphragm 110 is too soft and is not suitable as a vibrating body that oscillates ultrasonic waves.

That is, from a viewpoint of generating high-sound-pressure ultrasonic waves or preventing an occurrence of cracks due to the internal stress, it is preferable that a relationship of 0.25 CpTp/Cv≤Tv≤0.6 CpTp/Cv is satisfied. In the present example embodiment, for example, the thickness of the first diaphragm 110 is equal to or greater than about 0.1 mm and equal to or less than about 0.2 mm, and thus the ultrasonic transducer 100 can be driven in a state in which the internal stress (value normalized per sound pressure) in the height direction (Z-axis direction) generated in the ultrasonic transducer 100 is decreased.

Here, results of a simulation analysis using a finite element method to drive efficiency of the ultrasonic transducer in a case where the ultrasonic vibrator is a bimorph piezoelectric vibrator and in a case where the ultrasonic vibrator is a unimorph piezoelectric vibrator will be described. In order to match simulation analysis conditions with the conditions for the bimorph ultrasonic vibrator 130 illustrated in FIG. 1, the unimorph ultrasonic vibrator also has a structure in which the two piezoelectric bodies 131 are bonded to each other as illustrated in FIG. 1, and a drive voltage is applied to only one piezoelectric body 131 of the two, and another piezoelectric body 131 defines and functions as a second diaphragm to which a drive voltage is not applied.

Specifically, in an ultrasonic transducer of a first modification of an example embodiment of the present invention, the piezoelectric body 131 adjacent to the frame body 120 is applied with a drive voltage, and the piezoelectric body 131 not adjacent to the frame body 120 defines and functions as the second diaphragm to which no drive voltage is applied. In the first modification, the second diaphragm is provided on a side opposite to a frame body side of the piezoelectric body 131 to which the drive voltage is applied.

In an ultrasonic transducer of a second modification of an example embodiment of the present invention, the piezoelectric body 131 not adjacent to the frame body 120 is applied with a drive voltage, and the piezoelectric body 131 adjacent to the frame body 120 defines and functions as the second diaphragm to which no drive voltage is applied. In the second modification, the second diaphragm is provided on the frame body side of the piezoelectric body 131 to which the drive voltage is applied.

Figure 12:
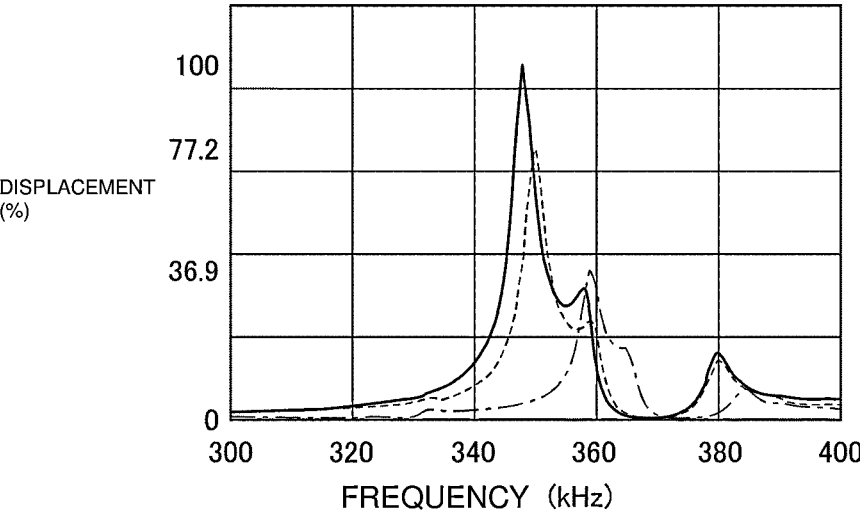
FIG. 12 is a graph obtained by a simulation analysis about a relationship between displacement of the first diaphragm and frequency of the ultrasonic vibrator using a finite element method, in each of the ultrasonic transducer according to Example Embodiment 1 of the present invention, an ultrasonic transducer according to a first modification of an example embodiment of the present invention, and an ultrasonic transducer according to a second modification of an example embodiment of the present invention.

FIG. 12 is a graph obtained by a simulation analysis about a relationship between displacement of the first diaphragm and frequency of the ultrasonic vibrator using a finite element method, in the ultrasonic transducer according to the present example embodiment, the ultrasonic transducer according to the first modification, and the ultrasonic transducer according to the second modification. In FIG. 12, a vertical axis represents the displacement of the first diaphragm 110, and a horizontal axis represents the frequency (kHz) of the ultrasonic vibrator 130. Data of the ultrasonic transducer 100 according to the present example embodiment is indicated by a solid line, data of the ultrasonic transducer according to the first modification is indicated by a dotted line, and data of the ultrasonic transducer according to the second modification is indicated by a dashed line.

As shown in FIG. 12, when the displacement of the first diaphragm 110 in the ultrasonic transducer 100 according to the present example embodiment was 100%, the displacement of the first diaphragm 110 of the ultrasonic transducer according to the first modification was about 77.28, and the displacement of the first diaphragm 110 of the ultrasonic transducer according to the second modification was about 36.9%. When a free capacitance of the piezoelectric element in the ultrasonic transducer 100 according to the present example embodiment was 100%, a free capacitance of a piezoelectric element in the ultrasonic transducer according to the first modification was about 54.28, and a free capacitance of a piezoelectric element in the ultrasonic transducer according to the second modification was about 59.2%.

When the piezoelectric elements are driven at the same voltage, power consumption is smaller for a piezoelectric element with a smaller free capacitance. It was discovered that displacement of the first diaphragm 110 that can be performed by the ultrasonic transducer according to the first modification is nearly 80% of displacement by the ultrasonic transducer 100 according to the present example embodiment with power consumption of about half that of the ultrasonic transducer 100 according to the present example embodiment, which is efficient.

In the present example embodiment, the ultrasonic vibrator 130 is, for example, a series bimorph piezoelectric vibrator, but the ultrasonic vibrator 130 may be a piezoelectric vibrator of another type. Hereinafter, an ultrasonic vibrator of an ultrasonic transducer according to a modification of Example Embodiment 1 of the present invention will be described.

Figure 13:
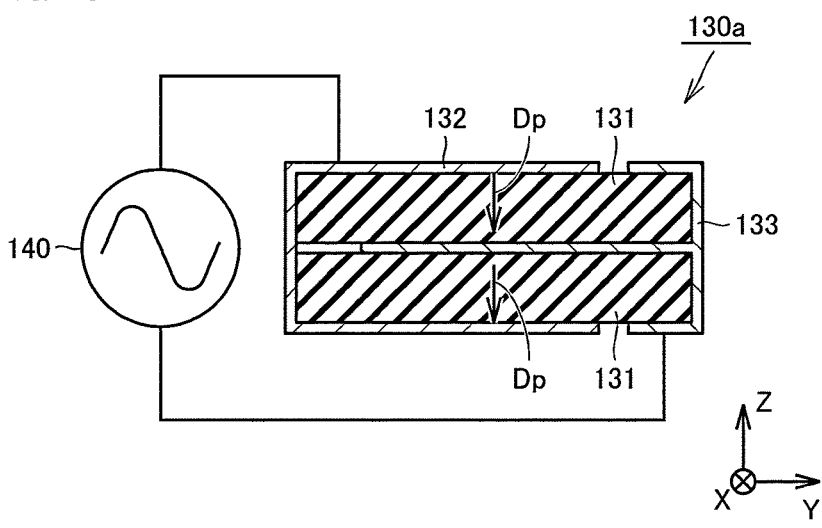
FIG. 13 is a sectional view illustrating a configuration of an ultrasonic vibrator according to a third modification of an example embodiment of the present invention.

FIG. 13 is a sectional view illustrating a configuration of an ultrasonic vibrator according to a third modification of an example embodiment of the present invention. As illustrated in FIG. 13, an ultrasonic vibrator 130a according to the third modification is a piezoelectric element including the two stacked piezoelectric bodies 131. The polarization directions Dp of the two piezoelectric bodies 131 are equal or substantially equal to each other. The ultrasonic vibrator 130a is a parallel bimorph piezoelectric vibrator.

Figure 14:
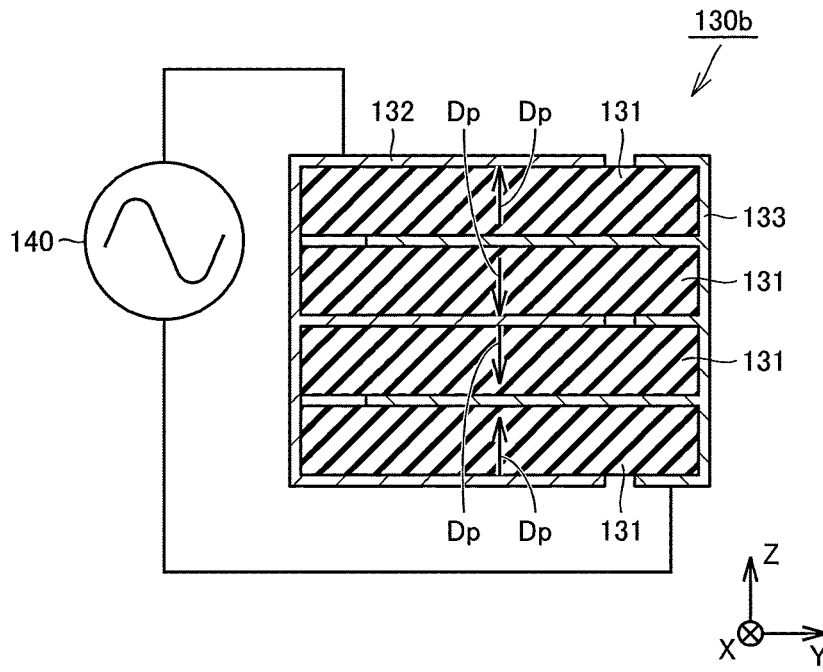
FIG. 14 is a sectional view illustrating a configuration of an ultrasonic vibrator according to a fourth modification of an example embodiment of the present invention.

FIG. 14 is a sectional view illustrating a configuration of an ultrasonic vibrator according to a fourth modification of an example embodiment of the present invention. As illustrated in FIG. 14, an ultrasonic vibrator 130b according to the fourth modification is a piezoelectric element including the four stacked piezoelectric bodies 131. The polarization directions Dp of the two piezoelectric bodies 131 positioned on outer sides among the four piezoelectric bodies 131 are oriented in one direction of the width direction (Z-axis direction), and the polarization directions Dp of the two piezoelectric bodies 131 positioned on inner sides among the four piezoelectric bodies 131 are oriented in another direction of the width direction (Z-axis direction). The ultrasonic vibrator 130b is a multimorph piezoelectric vibrator.

Figure 15:
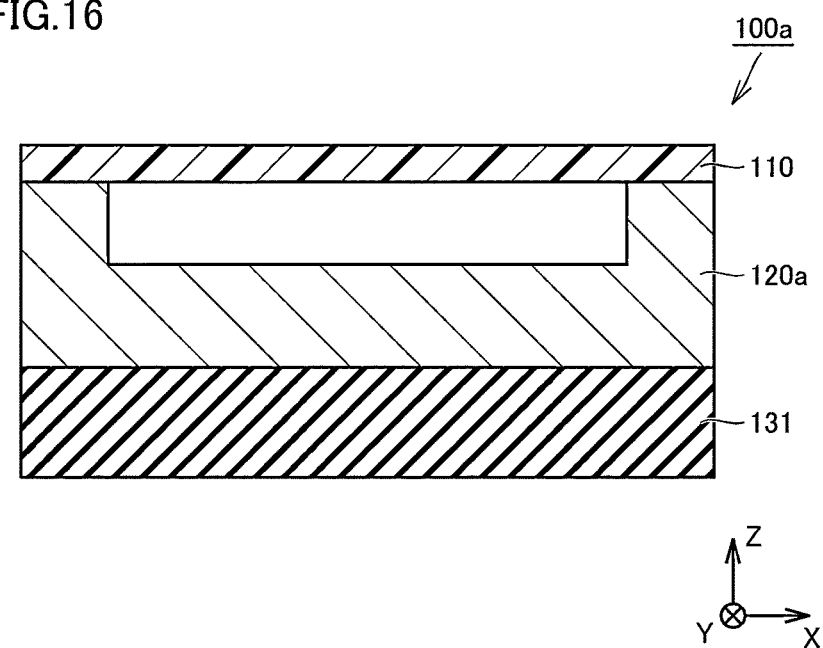
FIG. 15 is a sectional view illustrating a configuration of an ultrasonic vibrator according to a fifth modification of an example embodiment of the present invention.

FIG. 15 is a sectional view illustrating a configuration of an ultrasonic vibrator according to a fifth modification of an example embodiment of the present invention. As illustrated in FIG. 15, an ultrasonic vibrator 130c according to the fifth modification is a piezoelectric element including the one piezoelectric body 131. Specifically, the piezoelectric body 131 is sandwiched between the first electrode 132 and a second diaphragm 135 made of metal. The ultrasonic vibrator 130c is a unimorph piezoelectric vibrator.

FIG. 16 is a longitudinal sectional view illustrating a configuration of an ultrasonic transducer according to a sixth modification of an example embodiment of the present invention. As illustrated in FIG. 16, an ultrasonic transducer 100a according to the sixth modification includes the first diaphragm 110, a frame body 120a, and the ultrasonic vibrator 130. The frame body 120a has a bottomed cylindrical shape. The frame body 120a is made of metal. The piezoelectric body 131 is affixed to an outer bottom surface of the frame body 120a, and an ultrasonic vibrator which is a unimorph piezoelectric vibrator is provided.

The ultrasonic transducer 100 according to Example Embodiment 1 of the present invention includes the first diaphragm 110, the one or more frame bodies 120 and the one or more ultrasonic vibrators 130. The one or more frame bodies 120 extend in a length direction and are bonded to the first diaphragm 110. The one or more ultrasonic vibrators 130 are attached to the respective one or more frame bodies 120 and face the first diaphragm 110 with a space in between. The first diaphragm 110 resonates and vibrates in a direction orthogonal or substantially orthogonal to the first diaphragm 110 in a phase opposite to that of the one or more ultrasonic vibrators 130. The dimension L1 in the length direction inside the one or more frame bodies 120 is equal to or greater than four times the dimension L2 in a width direction orthogonal or substantially orthogonal to the length direction inside the one or more frame bodies 120. Thus, in the ultrasonic transducer 100, a sound pressure level can be increased with a simple and compact configuration.

In a parametric speaker including the ultrasonic transducer 100 according to Example Embodiment 1 of the present invention, an ultrasonic wave emitted from the ultrasonic transducer 100 can be modulated by modulation driving of the ultrasonic transducer 100 to reproduce an audible sound. As a modulation method, for example, there are an AM modulation method (amplitude modulation method) and an FM modulation method (frequency modulation method).

In the ultrasonic transducer 100 according to Example Embodiment 1 of the present invention, the resonant frequencies of the first diaphragm 110 and the ultrasonic vibrator 130 are, for example, equal to or higher than about 100 KHz. As will be described later, when the resonant frequencies are equal to or higher than about 100 kHz, attenuation of sound waves with respect to propagation distance is large, thus, when the resonant frequencies of the first diaphragm 110 and the ultrasonic vibrator 130 are equal to or higher than about 100 kHz, the parametric speaker including the ultrasonic transducer 100 can reproduce an audible sound in a limited space.

In the ultrasonic transducer 100 according to Example Embodiment 1 of the present invention, a relationship of 0.25 CpTp/Cv≤Tv≤0.6 CpTp/Cv is satisfied, where Cv is the acoustic velocity of the transverse wave of the first diaphragm 110, Cp is the acoustic velocity of the transverse wave of the piezoelectric body 131, Tv is the thickness dimension of the first diaphragm 110, and Tp is the thickness dimension of the piezoelectric body 131. This makes it possible to drive the ultrasonic transducer 100 in a state in which the internal stress (value normalized per sound pressure) in the height direction (Z-axis direction) generated in the ultrasonic transducer 100 is decreased. Accordingly, it is possible to generate high-sound-pressure ultrasonic waves while reducing or preventing an occurrence of cracks due to the internal stress in each of the bonding portion between the first diaphragm 110 and the frame body 120 and the bonding portion between the frame body 120 and the ultrasonic vibrator 130.

In the ultrasonic transducer 100 according to Example Embodiment 1 of the present invention, a relationship of 0.7 CpTp/Cv≤Tv≤1.3 CpTp/Cv is satisfied, where Cv is the acoustic velocity of the transverse wave of the first diaphragm 110, Cp is the acoustic velocity of the transverse wave of the piezoelectric body 131, Tv is the thickness dimension of the first diaphragm 110, and Tp is the thickness dimension of the piezoelectric body 131. Accordingly, it is possible to reduce or prevent vibration leakage while maintaining the physical balance between the first diaphragm 110 and the ultrasonic vibrator 130 during vibration, and increasing amplitude of the resonant vibration of the first diaphragm 110 to increase a sound pressure.

In the first modification of the ultrasonic transducer 100, the ultrasonic vibrator is a unimorph piezoelectric vibrator, and the second diaphragm is provided on the side of the piezoelectric body 131 opposite to the frame body side. This makes it possible to maintain the displacement of the first diaphragm 110 high while reducing power consumption, and to improve the efficiency of the ultrasonic transducer.

Example Embodiment 2

Hereinafter, an ultrasonic transducer according to Example Embodiment 2 of the present invention will be described with reference to the drawings. The ultrasonic transducer according to Example Embodiment 2 of the present invention is different from the ultrasonic transducer according to Example Embodiment 1 of the present invention in that a plurality of ultrasonic vibrators are arranged in an array, and thus description of a configuration the same as or similar to that of the ultrasonic transducer according to Example Embodiment 1 of the present invention will not be repeated.

Figure 17:
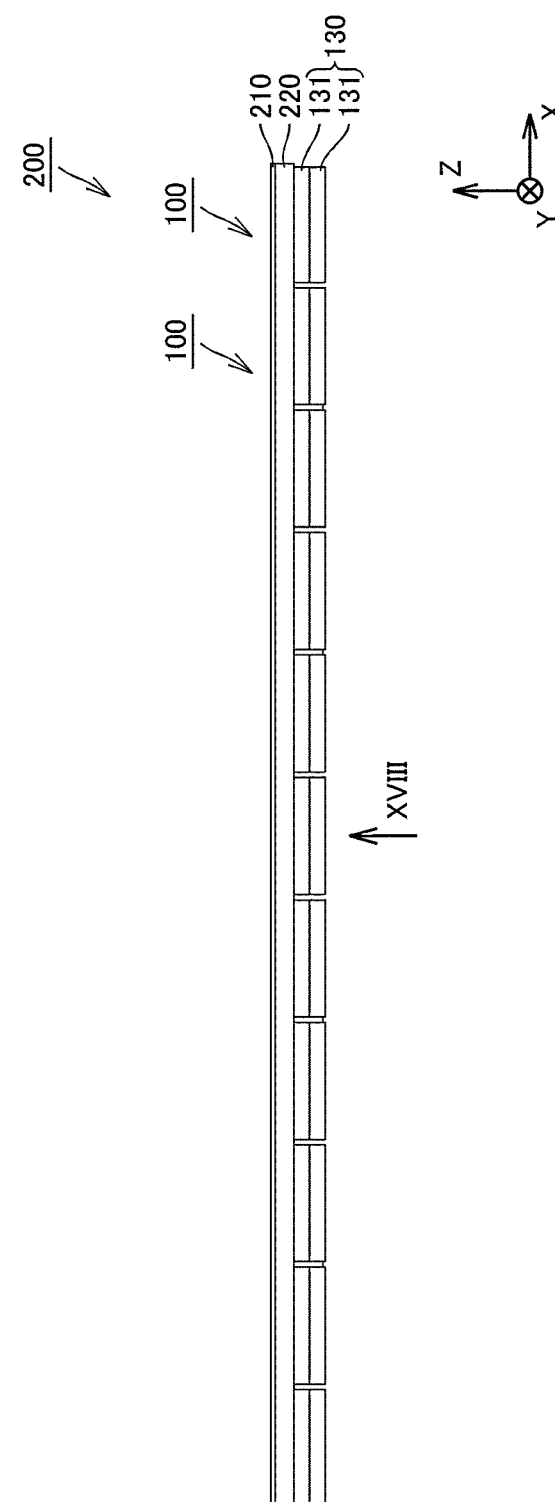
FIG. 17 is a side view illustrating a configuration of an ultrasonic transducer according to Example Embodiment 2 of the present invention.
Figure 18:
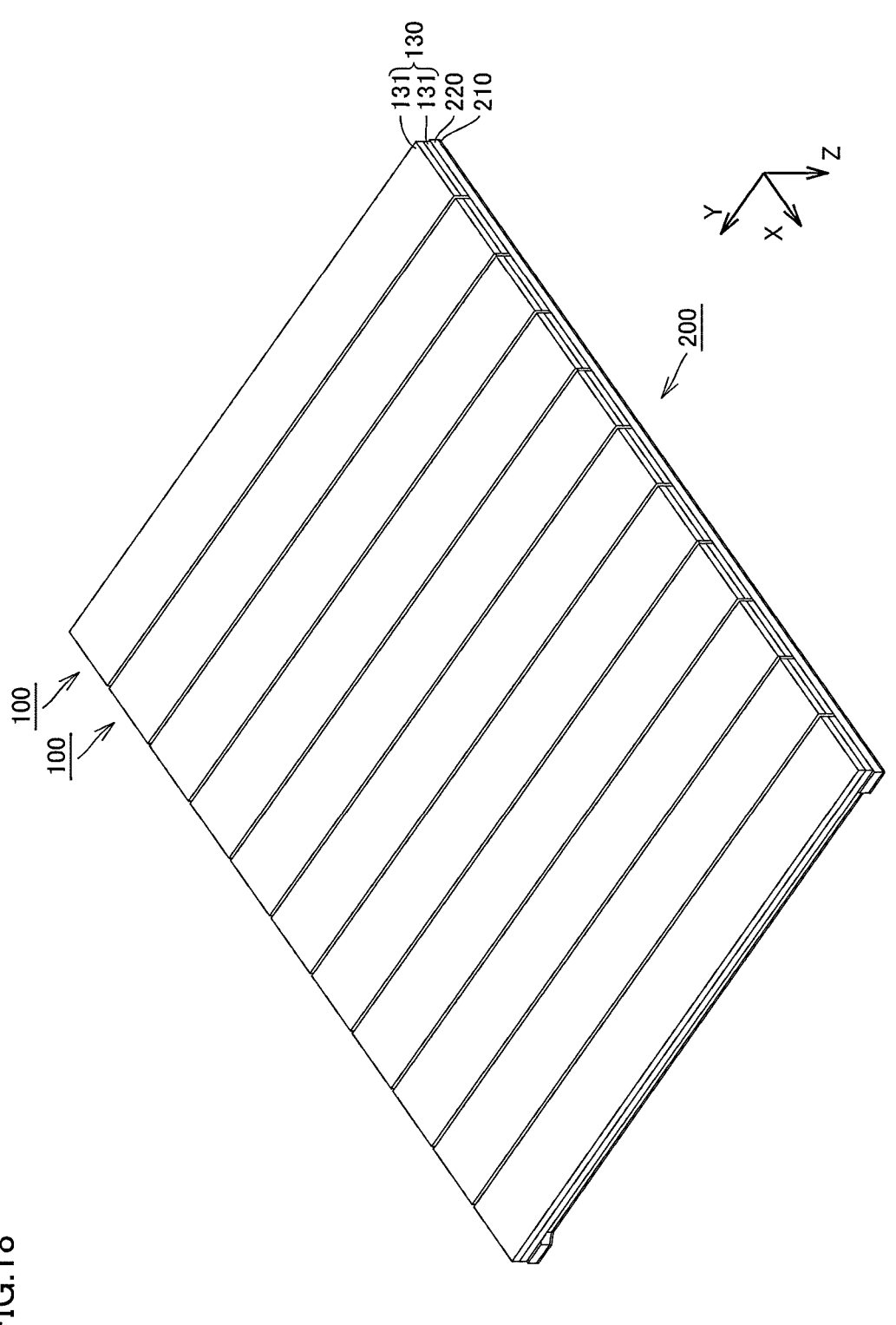
FIG. 18 is a rear view of the ultrasonic transducer illustrated in FIG. 17 as viewed in a direction of an arrow XVIII.

FIG. 17 is a side view illustrating a configuration of the ultrasonic transducer according to Example Embodiment 2 of the present invention. FIG. 18 is a rear view of the ultrasonic transducer illustrated in FIG. 17 as viewed in a direction of the arrow XVIII.

As illustrated in FIG. 17 and FIG. 18, in an ultrasonic transducer 200 according to Example Embodiment 2 of the present invention, the ultrasonic transducers 100 arranged side by side in an array in the width direction (X-axis direction) according to Example Embodiment 1 are integrally provided. The ultrasonic transducer 200 includes a first diaphragm 210, a plurality of frame bodies 220, and a plurality of the ultrasonic vibrators 130. The plurality of frame bodies 220 are bonded to the first diaphragm 210, and the plurality of ultrasonic vibrators 130 are bonded to the respective plurality of frame bodies 220.

Figure 19:
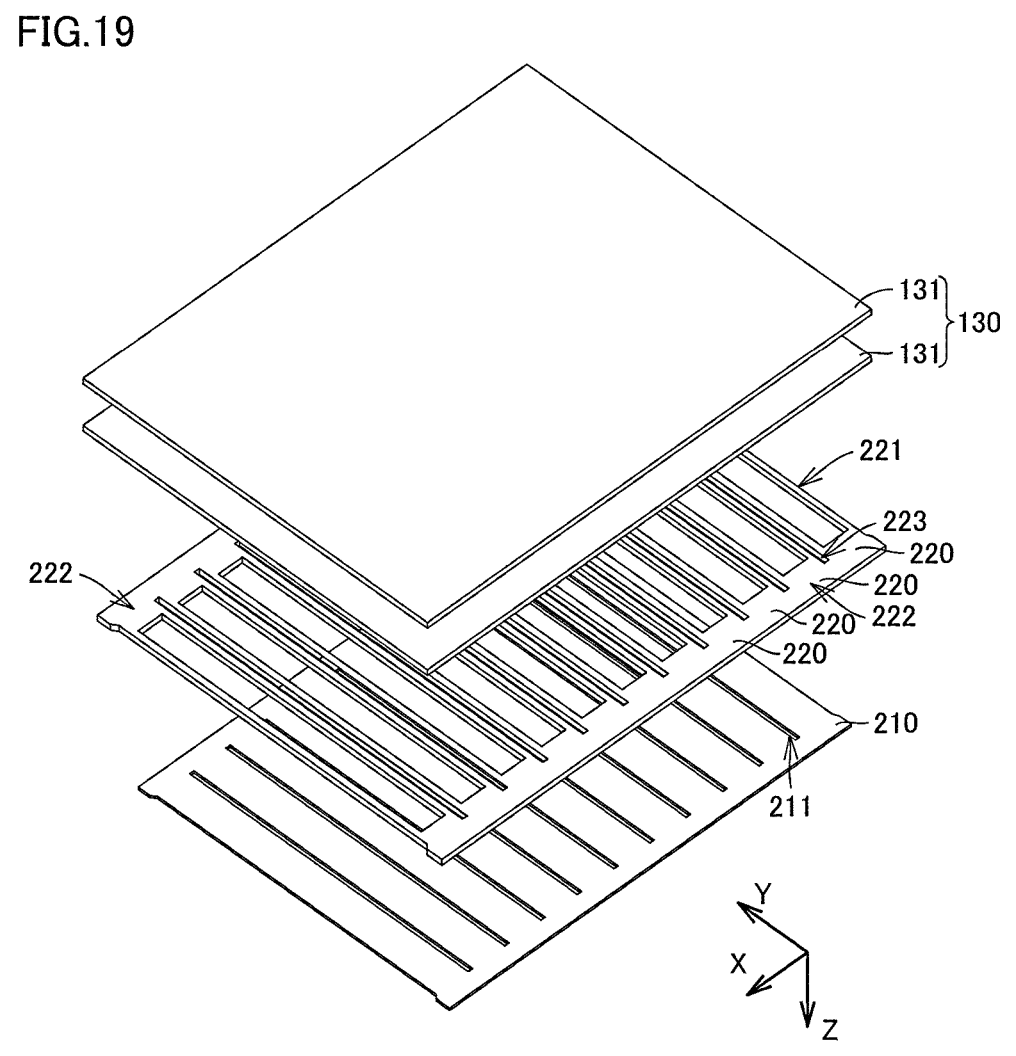

Here, an example of a method of manufacturing the ultrasonic transducer 200 will be described. FIG. 19 is an exploded perspective view illustrating a stacked state in a step of stacking and bonding components of the ultrasonic transducer according to Example Embodiment 2 of the present invention.

As illustrated in FIG. 19, the first diaphragm 210 has a flat plate shape, and a plurality of slits 211 extending in the length direction (Y-axis direction) are provided, with intervals in the width direction (X-axis direction) interposed between the slits. The first diaphragm 210 is made of, for example, an aluminum alloy such as duralumin including aluminum, or metal such as stainless steel. In the present example embodiment, the first diaphragm 210 is made of, for example, stainless steel. The plurality of slits 211 are formed by, for example, etching, cutting, or the like.

Each of the plurality of frame bodies 220 has a rectangular or substantially rectangular annular shape. Each of the plurality of frame bodies 220 includes a width direction (X-axis direction) and includes a length direction (Y-axis direction). Each of the plurality of frame bodies 220 extends in the length direction (the Y-axis direction). An axial direction of each of the plurality of frame bodies 220 is along the height direction (Z-axis direction). Each of the plurality of frame bodies 220 includes a pair of long side portions 221 extending in the length direction (Y-axis direction) and a pair of short side portions 222 extending in the width direction (X-axis direction). A shortest interval between the long side portions 221 is equal to or greater than four times a shortest interval between the short side portions 222.

The plurality of frame bodies 220 are arranged such that the frame bodies are aligned in the width direction (X-axis direction). A slit 223 is provided between the frame bodies 220 adjacent to each other in the width direction (X-axis direction). A plurality of the slits 223 are formed by, for example, etching, cutting, or the like. The long side portions 221 adjacent to each other in the frame bodies 220 adjacent to each other in the width direction (X-axis direction) are separated from each other by the slit 223.

The frame bodies 220 adjacent to each other in the width direction (X-axis direction) are connected to each other at the short side portions 222. That is, the frame bodies 220, of the plurality of frame bodies 220, adjacent to each other in the width direction are connected to each other at both end portions in the length direction.

Each of the frame bodies 220 is made of, for example, an aluminum alloy or metal such as stainless steel, glass epoxy, resin, or the like. In the present example embodiment, the plurality of frame bodies 220 include one thin plate, but the present invention is not limited thereto, and the short side portions 222 of the plurality of frame bodies 220 may be mutually bonded and integrally provided, where the plurality of frame bodies 220 are defined by respective thin plates.

In the present example embodiment, each of the plurality of ultrasonic vibrators 130 includes the two stacked piezoelectric bodies 131. As illustrated in FIG. 19, the two piezoelectric bodies 131 of the plurality of ultrasonic vibrators 130 are stacked and bonded in a state of two thin plates.

Figure 20:
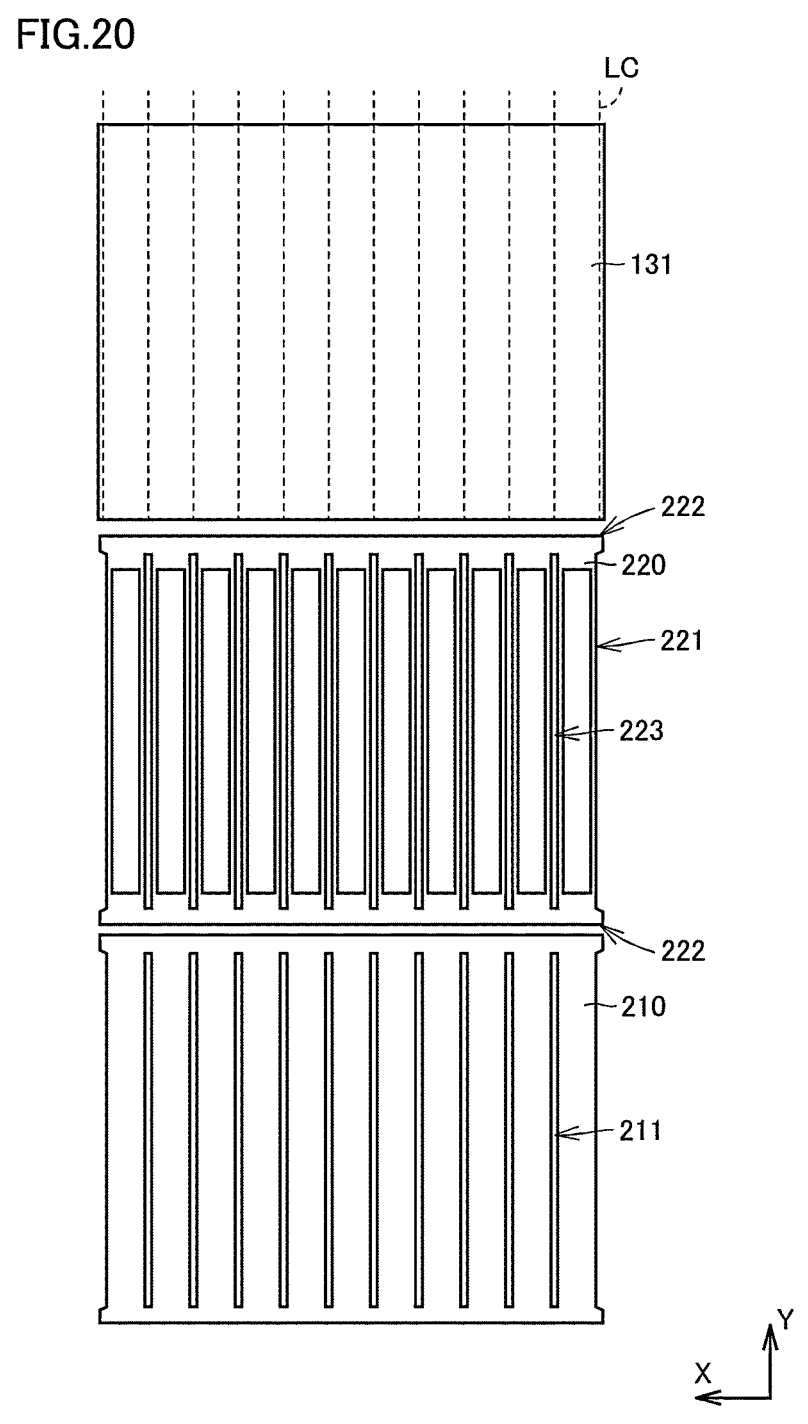

FIG. 20 is a plan view illustrating a positional relationship in the width direction (X-axis direction) in a step of cutting a piezoelectric body of the ultrasonic transducer according to Example Embodiment 2 of the present invention. In FIG. 20, only one piezoelectric body 131 is illustrated.

As illustrated in FIG. 20, the slit 211 and the slit 223 are positioned at the same or substantially the same position in the width direction (X-axis direction) so as to overlap each other in the height direction (Z-axis direction). The piezoelectric body 131 is cut and divided by, for example, a dicer or the like along a plurality of cut lines LC extending in the length direction (Y-axis direction) so as to overlap the slits 211 and the slits 223 in the height direction (Z-axis direction). As a result, the ultrasonic transducer 200 illustrated in FIG. 17 and FIG. 18 is formed.

Figures 21, 22:
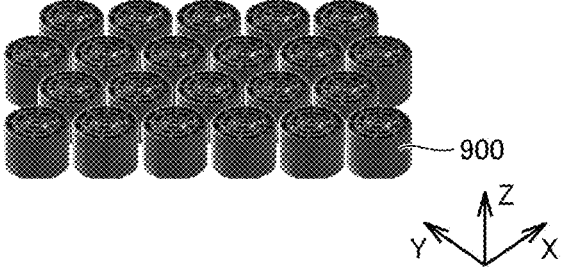
FIG. 21 is a perspective view showing a displacement state obtained by a simulation analysis using a finite element method when the ultrasonic transducer according to Example Embodiment 2 of the present invention is transmitting or receiving ultrasonic waves.
FIG. 22 is a perspective view illustrating a configuration of an ultrasonic element array according to a second comparative example.

FIG. 21 is a perspective view showing a displacement state obtained by a simulation analysis using a finite element method when the ultrasonic transducer according to Example Embodiment 2 of the present invention is transmitting or receiving ultrasonic waves.

As illustrated in FIG. 21, in the first diaphragm 210, an intermediate portion 210c positioned at a middle in a length direction inside each frame body 220 becomes an antinode of a resonant vibration, and end portions 210e positioned at respective ends in the length direction inside the frame body 220 become nodes of the resonant vibration. That is, a portion of the first diaphragm 210 positioned above an inner space of each frame body 220 is a vibrating region that resonates and vibrates. A longitudinal dimension of the vibrating region of the first diaphragm 210 is, for example, equal or substantially equal to a longitudinal dimension inside each frame body 220, and a short dimension of the vibrating region of the first diaphragm 210 is, for example, equal or substantially equal to a short dimension inside the frame body 220.

Since the ultrasonic transducer 100 according to Example Embodiment 1 includes node points at respective end portions in the length direction (Y-axis direction), even when the ultrasonic transducer 200 according to Example Embodiment 2 is configured by connecting the ultrasonic transducers 100 according to Example Embodiment 1 to each other at both the end portions to be arrayed, a resonant vibration of each ultrasonic transducer 100 is not inhibited. Thus, a sound pressure level can be easily increased by increasing the number of ultrasonic transducers 100 of the ultrasonic transducer 200 according to Example Embodiment 2.

In a parametric speaker including the ultrasonic transducer 200 according to Example Embodiment 2 of the present invention, an ultrasonic wave emitted from the ultrasonic transducer 200 can be modulated by modulation driving of the ultrasonic transducer 200 to reproduce an audible sound.

Here, a result of a simulation analysis about a relationship between ultrasonic frequency and sound pressure level attenuation due to propagation distance using a finite element method will be described. As simulation analysis conditions, transitions of attenuation due to propagation distance of an audible sound at a frequency of about 4 kHz reproduced from an ultrasonic wave of a resonant frequency of about 146 KHz transmitted from the ultrasonic transducer 200 according to the present example embodiment, and an audible sound at a frequency of 4 kHz reproduced from an ultrasonic wave at a resonant frequency of about 40 kHz transmitted from an ultrasonic element array according to a second comparative example were analyzed by simulation using a finite element method.

FIG. 22 is a perspective view illustrating a configuration of the ultrasonic element array according to the second comparative example. As illustrated in FIG. 22, in the ultrasonic element array according to the second comparative example, 50 ultrasonic elements 900 are arranged in a matrix with intervals in between.

Figure 23:
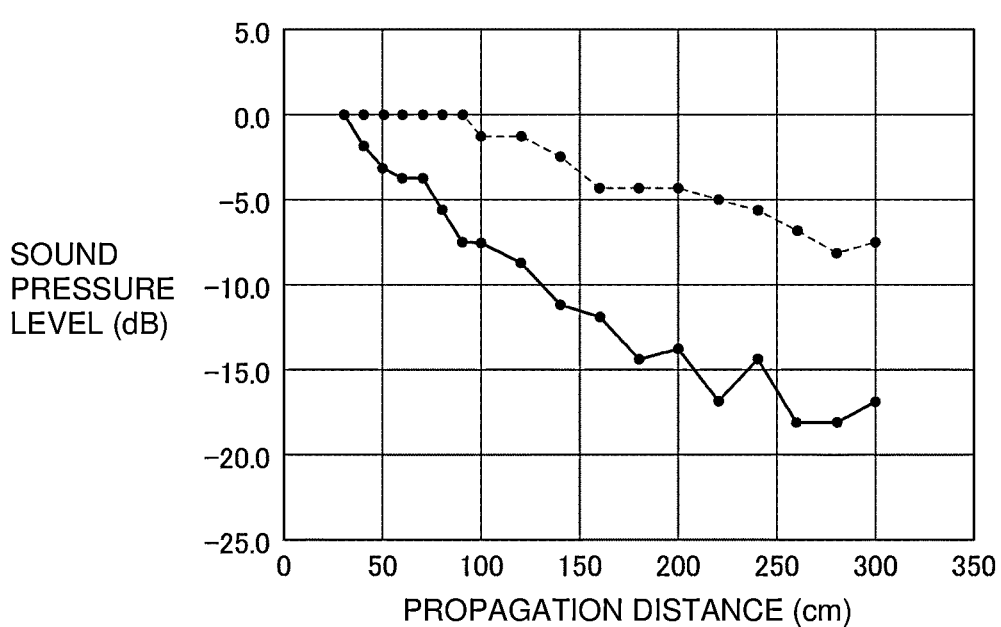
FIG. 23 is a graph obtained by actual measurement of attenuation transition of the sound pressure level due to propagation distance in the ultrasonic transducer according to Example Embodiment of the present invention and an ultrasonic transducer according to the second comparative example.

FIG. 23 is a graph obtained by actual measurement of the transitions of the sound pressure level attenuation due to the propagation distance in the ultrasonic transducer according to the present example embodiment and an ultrasonic transducer according to the second comparative example. In FIG. 23, a vertical axis represents the sound pressure level (dB), and a horizontal axis represents the propagation distance (cm). Data of the ultrasonic transducer 200 according to the present example embodiment is indicated by a solid line, and data of the ultrasonic transducer according to the second comparative example is indicated by a dotted line. The sound pressure level is a value obtained by normalizing a sound pressure level of an audible sound at a frequency of about 4 kHz at a point separated by about 30 cm in the height direction (Z-axis direction) from a front of each of the ultrasonic transducer and the ultrasonic element array, as 0 dB.

As shown in FIG. 23, an audible sound reproduced from an ultrasonic wave at a resonant frequency of about 146 kHz transmitted from the ultrasonic transducer 200 according to the present example embodiment was greatly attenuated due to propagation distance, as compared with an audible sound reproduced from an ultrasonic wave at a resonant frequency of about 40 kHz transmitted from the ultrasonic element array according to the second comparative example. This is because a high-frequency ultrasonic wave is easily absorbed by air as heat, and thus an audible sound reproduced using the high-frequency ultrasonic wave as a carrier wave is more greatly attenuated due to propagation distance.

As described above, in the parametric speaker including the ultrasonic transducer 200 according to the present example embodiment that transmits high-frequency ultrasonic waves at a frequency equal to or higher than about 100 kHz, it is possible to prevent sound from reaching an unnecessarily long distance and from leaking due to unnecessary reflection, and to reproduce an audible sound only in a limited space. In addition, in the ultrasonic transducer 200, since attenuation of an audible sound due to propagation distance can be increased without providing a configuration for transmitting a carrier wave of an opposite phase as in Japanese Patent No. 6333480, a simple and compact configuration can be achieved. Further, since an ultrasonic wave having a high frequency equal to or higher than about 100 kHz is outside an audible range of animals such as dogs and cats, an influence on these animals can be reduced or prevented.

As shown in FIG. 23, in order to attenuate an audible sound at a propagation distance of about 30 cm or longer, a Rayleigh length needs to be, for example, equal to or less than about 30 cm. A Rayleigh length R0 satisfies a relationship $R0=(k \times a^2)/2$. K is a wave number and a is a radius of a sound source. Thus, for example, when acoustic velocity in air is about 340 m/s, the longitudinal dimension of the vibrating region of the first diaphragm 210 is equal to or less than about 36 mm when an ultrasonic wave has a frequency at about 100 KHz, the longitudinal dimension of the vibrating region of the first diaphragm 210 is equal to or less than about 29.4 mm when an ultrasonic wave has a frequency at about 150 kHz, and the longitudinal dimension of the vibrating region of the first diaphragm 210 is equal to or less than about 25.5 mm when an ultrasonic wave has a frequency at about 200 kHz. When a frequency of an ultrasonic wave is equal to or higher than about 100 kHz, the longitudinal dimension L1 is equal to or greater than four times the short dimension L2 and equal to or less than 24 times the short dimension L2.

The ultrasonic transducer 200 according to the present example embodiment can be used, for example, as a phased array system.

Figure 24:
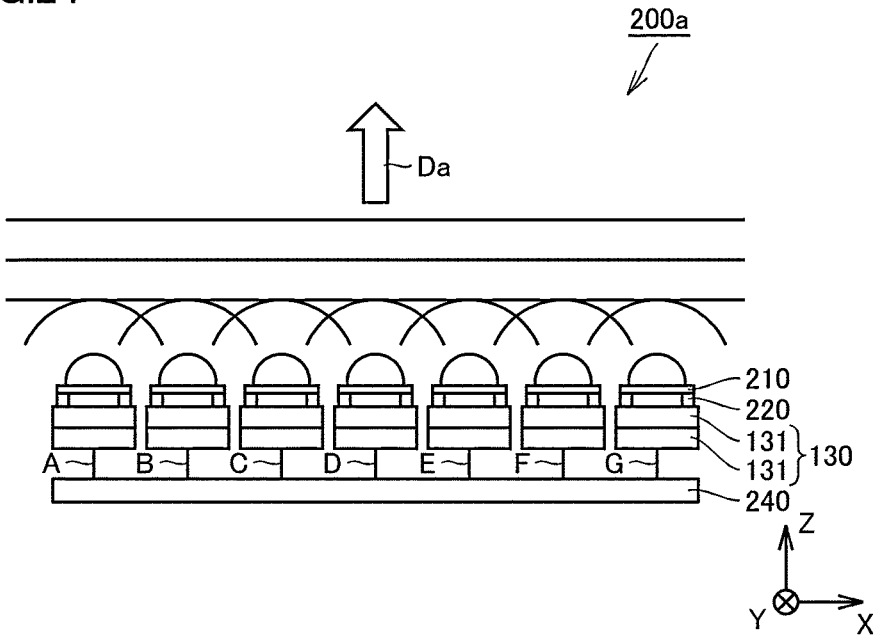
FIG. 24 is a side view illustrating a state in which an ultrasonic transducer according to a modification of an example embodiment of the present invention defining a phased array system planarly transmits ultrasonic waves in the height direction (Z-axis direction).

FIG. 24 is a side view illustrating a state in which an ultrasonic transducer according to a modification of the present example embodiment defining a phased array system planarly transmits ultrasonic waves in the height direction (Z-axis direction). As illustrated in FIG. 24, an ultrasonic transducer 200a according to the modification of the present example embodiment includes a processing circuit 240 configured or programmed to control timing of transmitting ultrasonic waves of each of the ultrasonic transducers A to G.

Figures 25, 26, 27:
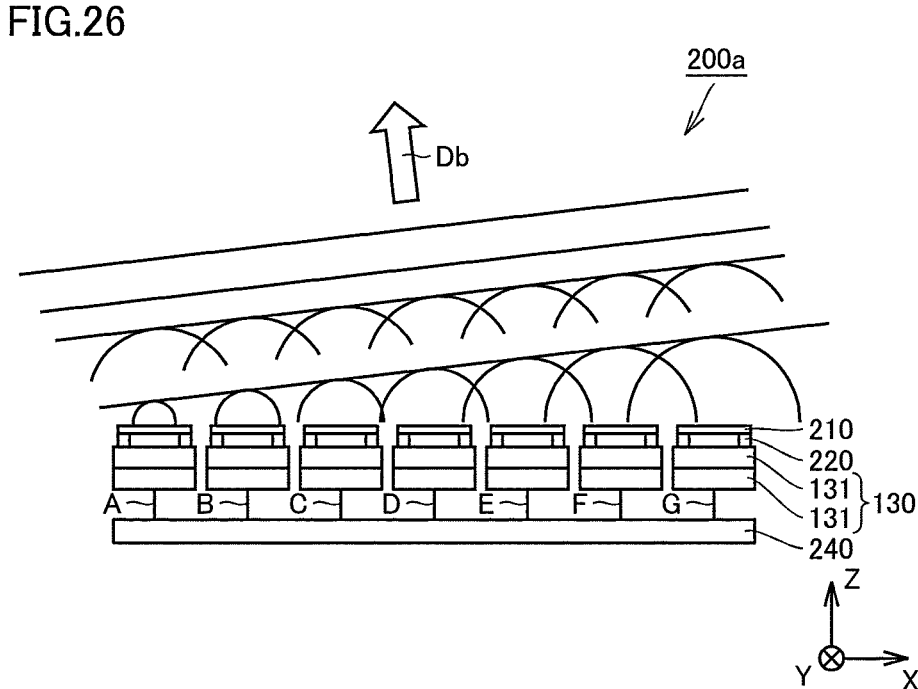
FIG. 25 is a graph showing a drive start delay time in a first state in which timing of transmitting ultrasonic waves is made the same by a processing circuit, for ultrasonic transducers A to G.
FIG. 26 is a side view illustrating a state in which an ultrasonic transducer according to a modification of an example embodiment of the present invention planarly transmits ultrasonic waves in an oblique direction inclined in the width direction (X-axis direction) with respect to the height direction (Z-axis direction).
FIG. 27 is a graph showing a drive start delay time in a second state in which ultrasonic waves are made to be transmitted in an order of the ultrasonic transducers G to A by the processing circuit.

FIG. 25 is a graph showing drive start delay time in a first state in which timing of transmitting ultrasonic waves is made the same or substantially the same by the processing circuit, for the ultrasonic transducers A to G. As shown in FIG. 25, in the first state in which the timing of transmitting ultrasonic waves is made the same or substantially the same by the processing circuit 240, for the ultrasonic transducers A to G, an ultrasonic wave Da is planarly transmitted in the height direction (Z-axis direction) as illustrated in FIG. 24.

FIG. 26 is a side view illustrating a state in which the ultrasonic transducer according to the modification of the present example embodiment planarly transmits ultrasonic waves in an oblique direction inclined in the width direction (X-axis direction) with respect to the height direction (Z-axis direction). FIG. 27 is a graph showing a drive start delay time in a second state in which ultrasonic waves are made to be transmitted in an order of the ultrasonic transducers G to A by the processing circuit. As shown in FIG. 27, in the second state in which the drive start delay times are increased in the order of the ultrasonic transducers G to A by the processing circuit 240, an ultrasonic wave Db is planarly transmitted in an oblique direction inclined in the width direction (X-axis direction) with respect to the height direction (Z-axis direction) as illustrated in FIG. 24.

Figure 28:
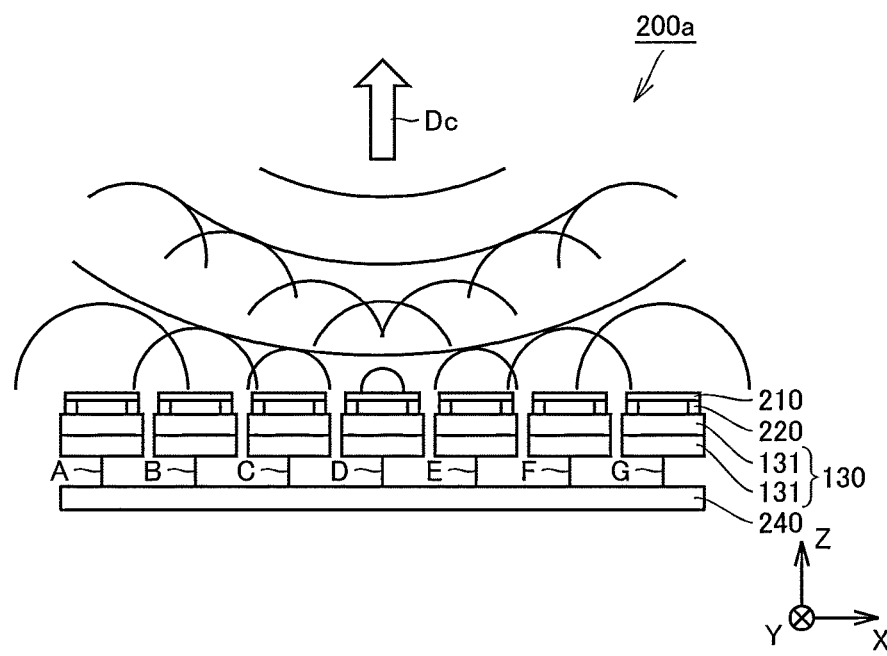
FIG. 28 is a side view illustrating a state in which the ultrasonic transducer according to a modification of an example embodiment of the present invention transmits ultrasonic waves in the height direction (Z-axis direction) so as to concentrate on a center in the width direction (X-axis direction).
Figure 29:
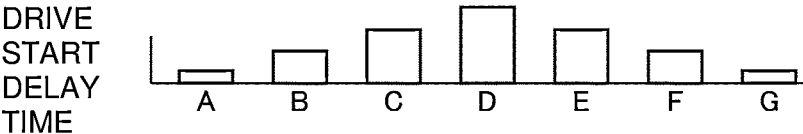
FIG. 29 is a graph showing drive start delay time in a third state in which ultrasonic waves are made to be transmitted in an order of the ultrasonic transducers A to D and in an order of the ultrasonic transducers G to D, by the processing circuit.

FIG. 28 is a side view illustrating a state in which the ultrasonic transducer according to the modification of the present example embodiment transmits ultrasonic waves in the height direction (Z-axis direction) so as to be concentrated on a center portion in the width direction (X-axis direction). FIG. 29 is a graph showing a drive start delay time in a third state in which ultrasonic waves are made to be transmitted in an order of the ultrasonic transducers A to D and in an order of the ultrasonic transducers G to D, by the processing circuit. As shown in FIG. 29, in the third state in which the processing circuit 240 increases the drive start delay times in the order of the ultrasonic transducers A to D and increases the drive start delay times in the order of the ultrasonic transducers G to D, an ultrasonic wave Dc is transmitted in the height direction (Z-axis direction) so as to be concentrated on the center portion of the ultrasonic transducer 200a in the width direction (X-axis direction) as illustrated in FIG. 28.

In the ultrasonic transducer 200 according to Example Embodiment 2 of the present invention, the one or more frame bodies 220 are arranged so as to be aligned in the width direction and are bonded to the first diaphragm 210, and the frame bodies 220, of the one or more frame bodies 220, adjacent to each other in the width direction are connected to each other at both end portions in the length direction. Thus, a sound pressure level can be easily increased.

The ultrasonic transducer 200a according to a modification of Example Embodiment 2 of the present invention can define and function as, for example, a phased array system.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An ultrasonic transducer, comprising:
   a first diaphragm;
   one or more frame bodies extending in a length direction and bonded to the first diaphragm; and
   one or more ultrasonic vibrators attached to the one or more frame bodies, respectively,
   and facing the first diaphragm with a space therebetween;
   wherein the first diaphragm is structured to resonate and vibrate in a direction orthogonal or substantially orthogonal to the first diaphragm in a phase opposite to a phase of the one or more ultrasonic vibrators; and a dimension in the length direction inside the one or more frame bodies is equal to or greater than four times a dimension in a width direction orthogonal or substantially orthogonal to the length direction inside the one or more frame bodies.

2. The ultrasonic transducer according to claim 1, wherein the one or more ultrasonic vibrators are each a piezoelectric element including a piezoelectric body.

3. The ultrasonic transducer according to claim 1, wherein the first diaphragm and the one or more ultrasonic vibrators have resonant frequencies equal to or higher than about 100 kHz.

4. The ultrasonic transducer according to claim 2, wherein a relationship of 0.25CpTp/Cv≤Tv≤0.6CpTp/Cv is satisfied, where Cv is acoustic velocity of a transverse wave of the first diaphragm, Cp is acoustic velocity of a transverse wave of the piezoelectric body, Tv is a thickness dimension of the first diaphragm, and Tp is a thickness dimension of the piezoelectric body.

5. The ultrasonic transducer according to claim 2, wherein a relationship of 0.7CpTp/Cv≤Tv≤1.3CpTp/Cv is satisfied, where Cv is acoustic velocity of a transverse wave of the first diaphragm, Cp is acoustic velocity of a transverse wave of the piezoelectric body, Tv is a thickness dimension of the first diaphragm, and Tp is a thickness dimension of the piezoelectric body.

6. The ultrasonic transducer according to claim 1, wherein
the one or more frame bodies are aligned in the width direction and are bonded to the first diaphragm; and
frame bodies, of the one or more frame bodies, adjacent to each other in the width direction are connected to each other at both end portions in the length direction.

7. The ultrasonic transducer according to claim 2, wherein
the one or more ultrasonic vibrators are each a unimorph piezoelectric vibrator; and
a second diaphragm is provided on a side of the piezoelectric body opposite to a frame body side.

8. The ultrasonic transducer according to claim 1, wherein the first diaphragm includes duralumin including aluminum or stainless steel.

9. The ultrasonic transducer according to claim 1, wherein a thickness of the first diaphragm is equal to or greater than about 0.1 mm and equal to or less than about 0.2 mm.

10. The ultrasonic transducer according to claim 1, wherein a thickness of each of the one or more frame bodies is equal to or greater than about 0.2 mm and equal to or less than about 0.8 mm.

11. A parametric speaker, comprising:
the ultrasonic transducer according to claim 1; wherein
an audible sound is capable of being reproduced by modulation driving of the ultrasonic transducer.

12. The parametric speaker according to claim 11, wherein the one or more ultrasonic vibrators are each a piezoelectric element including a piezoelectric body.

13. The parametric speaker according to claim 11, wherein the first diaphragm and the one or more ultrasonic vibrators have resonant frequencies equal to or higher than about 100 kHz.

14. The parametric speaker according to claim 12, wherein a relationship of 0.25CpTp/Cv≤Tv≤0.6CpTp/Cv is satisfied, where Cv is acoustic velocity of a transverse wave of the first diaphragm, Cp is acoustic velocity of a transverse wave of the piezoelectric body, Tv is a thickness dimension of the first diaphragm, and Tp is a thickness dimension of the piezoelectric body.

15. The parametric speaker according to claim 12, wherein a relationship of 0.7CpTp/Cv≤Tv≤1.3CpTp/Cv is satisfied, where Cv is acoustic velocity of a transverse wave of the first diaphragm, Cp is acoustic velocity of a transverse wave of the piezoelectric body, Tv is a thickness dimension of the first diaphragm, and Tp is a thickness dimension of the piezoelectric body.

16. The parametric speaker according to claim 11, wherein
the one or more frame bodies are aligned in the width direction and are bonded to the first diaphragm; and
frame bodies, of the one or more frame bodies, adjacent to each other in the width direction are connected to each other at both end portions in the length direction.

17. The parametric speaker according to claim 12, wherein
the one or more ultrasonic vibrators are each a unimorph piezoelectric vibrator; and
a second diaphragm is provided on a side of the piezoelectric body opposite to a frame body side.

18. The parametric speaker according to claim 11, wherein the first diaphragm includes duralumin including aluminum or stainless steel.

19. The parametric speaker according to claim 11, wherein a thickness of the first diaphragm is equal to or greater than about 0.1 mm and equal to or less than about 0.2 mm.

20. The parametric speaker according to claim 11, wherein a thickness of each of the one or more frame bodies is equal to or greater than about 0.2 mm and equal to or less than about 0.8 mm.

* * * * *